United States Patent [19]

Tsuruta et al.

[11] Patent Number: 4,507,383
[45] Date of Patent: Mar. 26, 1985

[54] MATERIAL FOR A PLANOGRAPHIC PLATE AND A METHOD OF PREPARING SUCH MATERIAL

[75] Inventors: Hirobumi Tsuruta, Tokyo; Kiichi Kondo, Ageo, both of Japan

[73] Assignees: Sankyo Rikagaku Kabushiki Kaisha, Tokyo; Daishin Kagaku Kogyo Kabushiki Kaisha, Saitama, both of Japan

[21] Appl. No.: 547,828

[22] Filed: Nov. 2, 1983

Related U.S. Application Data

[63] Continuation-in-part of Ser. No. 427,328, Sep. 29, 1982, abandoned.

[30] Foreign Application Priority Data

Oct. 12, 1981 [JP] Japan ............................. 56-161060
Jan. 21, 1982 [JP] Japan ............................. 57-008207

[51] Int. Cl.³ .................... G03C 1/94; G03C 1/76; G03F 7/02
[52] U.S. Cl. .................. 430/275; 430/302; 430/523; 430/525; 430/531; 430/533; 430/535; 430/536; 430/271; 430/272

[58] Field of Search .......... 430/204, 302, 271, 271 A, 430/272, 276, 264, 523, 525, 531, 533, 535, 536, 950; 101/455, 465, 458

[56] References Cited

U.S. PATENT DOCUMENTS

| | | | |
|---|---|---|---|
| 2,311,889 | 11/1941 | Toland et al. | 430/302 X |
| 3,764,455 | 10/1973 | Lovell et al. | 428/149 |
| 4,098,188 | 7/1978 | Stroszynski | 430/300 |
| 4,175,964 | 11/1979 | Uchida et al. | 430/306 X |
| 4,289,071 | 9/1981 | Hallman et al. | 430/300 X |
| 4,336,319 | 6/1982 | Nagashima et al. | 430/302 X |

Primary Examiner—John E. Kittle
Assistant Examiner—Cynthia Hamilton
Attorney, Agent, or Firm—Jordan and Hamburg

[57] ABSTRACT

A material for a planographic plate includes a thin layer of a water-resistant adhesive on a substrate and finely divided particles adhered to the adhesive. The method includes applying the finely divided particles to the adhesive in a manner such that the ratio of the thickness of the adhesive layer to the average diameter of the finely divided particles is in the range of from 0.2 to 0.4.

12 Claims, 4 Drawing Figures

MATERIAL FOR A PLANOGRAPHIC PLATE AND A METHOD OF PREPARING SUCH MATERIAL

This is a Continuation-in-Part application of U.S. Ser. No. 427,328 filed Sept. 29, 1982, now abandoned.

BACKGROUND OF THE INVENTION

Unlike the construction of a conventional planographic-plate material in which the surface of an aluminum or zinc sheet is made rough by surface graining, the construction of the plate material of the present invention is characterized in that the surface of a thin sheet as a substrate is made rough by adhering finely divided, solid, metallic or nonmetallic particles to a thin sheet previously coated with an adhesive by uniform sprinkling, that is, the substrate and the finely divided solid particles function respectively as a support and a surface-roughing material.

In the plate material of the present invention, a rough surface which consists of fine spherical surfaces of finely divided solid, metallic or nonmetallic particles has the ability to form a more strongly hydrophilic water-film, as a result of desensitization of the surface with a treating solution comprising weak acids. If the adhesion of finely divided solid particles to a substrate is done under a predetermined condition of the ratio of the thickness of the adhesive layer to the average diameter of the fine solid particles, then the fine-particle layer ranging from a monoparticulate layer to a multi-particulate layer can be formed. As regards the microscopic state of the rough surface, each of the finely divided particles is adhered at its bottom to the substrate, and adjoining, finely divided particles are adhered at their respective adjoining portions to one another to form an indefinite number of extremely small voids between the adjoining, finely divided particles. Therefore, there is an advantage that the desensitizing agent penetrates deep into an indefinite number of the extremely small voids between the fine particles and thereby sufficient desensitization is achieved. By virtue of this advantage, the plate material substantially scarcely causes any scumming in printing and, hence, it is useful as an excellent plate material. In the plate material of the invention, the rough surface which has been treated with the desensitizing agent is further coated with a positive- or negative-type photosensitizing solution. Consequently, the plate material possesses an advantage that, instead of normal pre-sensitized plates, it can be put, at a relatively low price, into practical use as a plate material for offset printing.

Other features which are considered characteristic of the invention are set forth in the appended claims.

Although the invention is illustrated and described in relationship to specific embodiments, it is nevertheless not intended to be limited to the details shown, since various modifications and structural changes may be made therein without departing from the spirit of the invention and within the scope and range of equivalents of the claims.

The construction and operation of the invention, however, together with additional objects and advantages thereof will be best understood from the following description of specific embodiments when read in connection with the accompanying drawings.

DESCRIPTION OF THE PREFERRED EMBODIMENTS

Figure 1:
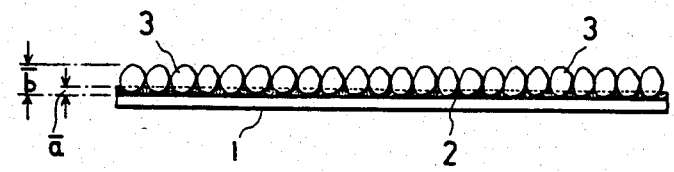
FIG. 1 is an end view of finely divided particles, adhesive and substrate according to one embodiment of the invention.
Figure 2:
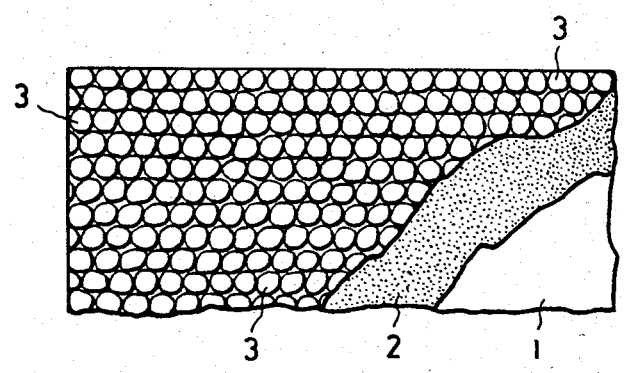
FIG. 2 is a plan view of FIG. 1, partially cut away.

Referring to FIGS. 1 and 2, reference numeral 1 denotes a substrate consisting of a synthetic resin film or a metallic sheet. The surface of the substrate is such as to facilitate adhesion. Synthetic-resin films suitable for the substrates include a synthetic resin film which is made by an ordinary film-manufacturing technique and whose surface has a structure of micro-voids and a synthetic resin film which is surface-activated by corona-discharge treatment or by degreasing with organic solvents. As for a metallic sheet, it may be surface-activated by sandblast graining or brush graining.

A requirement of any synthetic-resin film as a substrate is that the film should have such water-resistance and dimensional stability that the increase in two dimensions (length and width) on immersion in water for 2 hours at room temperature are 0.5% or less of its dry dimensions. Another requirement is that the elongation percentage of the width of the film is 1% or less under a continuous tensile load of 5 kg per 25 mm during immersion in water for 2 hours at room temperature. Synthetic-resin films satisfying the above-mentioned requirements include biaxially oriented polyethylene, polypropylene, polystyrene, polycarbonate, polyethylene-terephthalate and nylon films. As a composite substrate, there may be used a composite laminate comprising a foil of zinc or such light metal as aluminum and a synthetic resin film. Furthermore, there may be used a composite laminate made by joining a thin sheet of cellulose paper and a synthetic-resin film together.

Reference numeral 2 in FIGS. 1 and 2 designates a layer of an adhesive laid over the substrate 1. Specific adhesives are selected according to the types of the materials to be bonded. The adhesives used are of the type utilizing thermosetting resins or other synthetic resins having comparable heat resistance. The adhesives should be oil-soluble and have the ability to firmly adhere finely divided solid particles 3 to the substrate 1 in forming the cured or dried thin film. The cured or dried thin film should not be affected at all even by rubbing its surface under the condition of wetting by acidic or alkaline aqueous solutions ranging in pH from 2 to 14 and should have resistances to water and also to organic solvents. Suitable synthetic resins used in the adhesives include phenolic resins, urea resins, epoxy resins, and polyurethane.

Reference numeral 3 represents finely divided solid, metallic or nonmetallic particles adhered to the substrate 1 with the adhesive 2. Stainless steel, aluminum, zinc, or silver, which has a surface-activity in a particulate form, may be employed as a raw material for the finely divided solid metallic particles. In addition, silicon, which is a nonmetallic element, may be used as a raw material for the finely divided solid nonmetallic particles. Especially useful are finely divided particles of zinc prepared by an evaporation-solidification process, followed by an air-classification operation with a careful selection of particle-size distribution. The finely divided particles of the materials mentioned above have particle diameters ranging from $3\mu$ to $15\mu$ and are sprinkled on the substrate 1 to form a uniform fine grain thereon.

The present inventors' investigation of the relationship between the thickness of a layer of an adhesive in an uncured or undried state and the average diameter of finely divided solid particles has led to the discovery that in the case where the ratio $\bar{a}/\bar{b}$ is in the effective range of 0.2 to 0.4, where $\bar{a}$ is the thickness of the uncured or undried adhesive layer and $\bar{b}$ is the average diameter of the finely divided solid particles. The spread, uncured or undried adhesive does not seep through voids between the fine solid particles to the surface of a layer thereof, that is, it does not emerge from the layer of the finely divided solid particles. Therefore, when a printing plate based on the plate material thus constructed is used in offset printing, non-printing areas of the printing surface are not stained with printing ink.

When the ratio $\bar{a}/\bar{b}$ is above the effective range of 0.2 to 0.4, the adhesive spread on the substrate is thick within the voids between the finely divided solid particles and a part of the surface of the layer of the cured or dried adhesive is formed above the surface of the layer of the fine solid particles. Such a layer of the cured or dried adhesive, which is water-repellant, does not become sufficiently hydrophilic even by densensitization, that is, such an adhesive layer has a strong, ink-receptivity. When a printing plate based on the plate material so constructed is used in offset printing, even the non-printing areas of the printing surface where the reception of ink must be avoided receive ink, which fact causes scumming on matter being printed, thus lessening the expressive effect of printed matter or turning it into waste matter. Hence such a printing plate is not printable.

When the ratio $\bar{a}/\bar{b}$ is below the effective range of 0.2 to 0.4, the cured or dried adhesive is thin between the finely divided solid particles so that the strength of the fine-particle layer to substrate bond is decreased, which fact makes a printing plate based on the plate material so constructed unable to retain the desired durability. Consequently, such a printing plate cannot be put to practical use.

Figure 3:
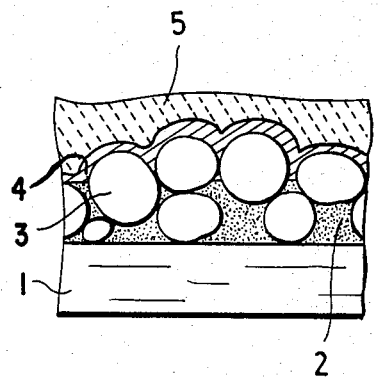
FIG. 3 is a partial sectional view showing the desensitization of the surface with a treating solution comprising weak acids.
Figure 4:
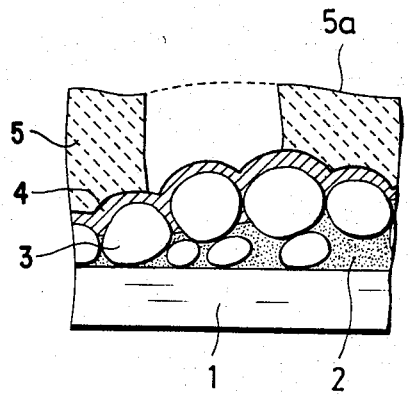
FIG. 4 is a partial sectional view showing the photosensitive material on the particle layer and which has been exposed to light.

In FIG. 3, the numeral 4 denotes the desensitization of the surface with the treating solution comprising weak acids. In FIG. 4, the numeral 5 denotes the photosensitizing material containing a diazo-type photosensitive polymer on the particles while numeral 5a denotes the remaining surface after the process has been completed and exposed to light. As shown in FIG. 3, the surfaces of the particles are treated by the desensitizing agent 4 to further hydrophlicize the surfaces. The particles are then coated with the photosensitizing layer 5 and then dried. As shown in FIG. 4, the photosensitive layer is exposed to light in the plate forming steps and is partly removed to define the remaining parts 5a which have not been exposed to light. Namely, the remaining photosensitizing layer 5a is oleophilic.

EXAMPLE 1

As a substrate, there was selected a synthetic-resin film of 155 g/m$^2$ on the basis of weight and $200\mu$ in thickness; namely, a polypropylene film of a special structure obtained by the method for manufacturing a biaxially oriented film. As an adhesive, there was selected a solution of a bisphenol-epichlorohydrin epoxy resin of 190 epoxy equivalent and a dimer acid-based polyamide resin of 220 amine value (1:1 weight ratio of the epoxy resin to the polyamide resin) in xylene-butanol, at 50% solids. The adhesive was evenly spread over the substrate on a doctor roll coater to a thickness of $5\mu$ and dried at 70° C. for 30 seconds to remove the volatile solvents. Finely divided zinc particles of 5 to $9\mu$ in particle diameter were then sprinkled uniformly on the adhesive layer at a rate of 15 g/m$^2$ and bonded to the substrate by dry-air curing the adhesive layer at 80° C. for 15 minutes. The in-process article for a plate material was subsequently submerged in a desensitizing solution at pH 4 consisting of a mixed solution of phosphoric, acetic and silicic acids for 5 seconds to make the surfaces of the fine zinc particles hydrophilic, washed with water, and dried. A printing-plate material was finished by coating the fine-zinc particle layer thus endowed with hydrophilicity, with a photo-sensitizing solution containing a diazo-type photosensitive polymer as the main ingredient under a safelight to the wet coating thickness such that the dry coating thickness was in the range of 1.5 to $3.0\mu$, followed by ordinary finishing.

EXAMPLE 2

This example is concerned with a preparation method of the present invention. Experiments were carried out under various conditions and ratios of the adhesive layer's thickness to the weight-average diameter of finely divided zinc particles. Twelve polypropylene films each of 170 g/m$^2$ in basis weight, as substrates, were provided for the experiments. The weight-average diameter and particle-size distribution of the finely divided zinc particles were calculated prior to the use thereof for each substrate by an air-classification method, and the shapes of the fine zinc particles were observed under a microscope or by use of projection. As the adhesive there was selected a solution of bisphenol-epichlorohydrin epoxy resin of 190 epoxy equivalent and a dimer acid-based polyamide resin of 220 amine value (1:1 weight ratio of the epoxy resin to the polyamide resin) in xylene-butanol, at 50% solids. Required quantities of the adhesive used were calculated in advance from the weight-average diameters and the particle shapes obtained above. The adhesive was spread on the polypropylene film with adjustment of the clearance between a doctor roll and a feed roll so that the thickness of the adhesive layer conformed with that given Table I, and hot-air dried at 70° C. for 30 seconds to remove volatile solvents. The finely divided zinc particles of different weight-average particle diameters shown in Table I were bonded to the substrates by sprinkling on the adhesive layers with vibration, with varying ratios of the spread thickness $\bar{a}$ of the adhesive to the average particle diameter $\bar{b}$ of the fine zinc particles, followed by hot-air drying at 120° C. for 20 minutes and by cooling to room temperature to give first in-process articles for printing-plate materials.

The surface of the layer of the finely divided particles in each of the twelve first in-process articles for the printing-plate materials was desensitized under the same condition as in Example 1 to produce a second in-process article for the printing-material plate. A comparison was made between the degrees of hydrophilicity of the desensitized surfaces in terms both of contact angles obtained by surface-tension measurements and of grades obtained by an inking-test method. Furthermore, another comparison was made between those strengths of the fine-particle layer to substrate bonds which were determined by an abrasion-test method. When the ratio $\bar{a}/\bar{b}$ of the thickness $\bar{a}$ of the adhesive layer to the average diameter $\bar{b}$ of the finely divided zinc particles was in the range of from 0.2 to 0.4, the hydrophilicity as well as the strength of the fine-zinc-particle layer to substrate bond was excellent as can be seen in Table II.

The twelve second in-process articles for the printing-plate materials were coated with a diazide-type photosensitizing solution by an ordinary technique under different treating conditions to give various printing-plate materials. A positive-type film having dot images was superposed on each of the twelve various printing-plate materials and each set of the positive-type film and the printing-plate material was set in a pneumatic printing frame. By use of a 2-kW extra-high pressure mercury vapor lamp, the printing surface of the printing-plate material was exposed to light through the positive-type film, and the printing-plate material was then developed by immersion in an alkaline developer and also by rubbing the printing surface with a sponge, followed by washing with water to provide a printing plate. Each of the twelve printing plates thus obtained was mounted on a plate cylinder of an offset printing press and printing was performed according to an ordinary method by use of a black offset ink under a given condition. A comparison was made between those durabilities of the twelve printing plates which were expressed in terms of the number of sheets of the matter that had been printed until the percentage of non-reproduced dot images in 150 printed dot-lines to the total dot images went up to 5%. Furthermore, another comparison was made between those ink-stain resistances of non-printing areas in the printing surfaces of the printing plates which were expressed in terms of the number of sheets of the matter that had been printed until black scumming took place on matter being printed. The printing that did not matter in practical application was able to be done from any one of the printing plates having the ratio $\bar{a}/\bar{b}$ where $\bar{a}$ is the thickness of the adhesive layer and $\bar{b}$ is the average diameter of the finely divided zinc particles in the range of from 0.2 to 0.4, as can be seen in Table III. In the case where the ratio $\bar{a}/\bar{b}$ was below 0.2, the omission of dots took place rapidly on matter being printed. When, contrary to this, the ratio $\bar{a}/\bar{b}$ was above 0.4, scummings took place on matter being printed.

TABLE I

| Symbol of plate material | Thickness $\bar{a}$ of adhesive layer (Unit: μ) | Average particle dia. $\bar{b}$ of fine solid particles (Unit: μ) | Ratio $\frac{\bar{a}}{\bar{b}}$ |
| --- | --- | --- | --- |
| A | 2.00 | 15 | 0.133 |
| B | 1.20 | 20 | 0.06 |
| C | 2.00 | 40 | 0.05 |
| D | 0.60 | 3 | 0.20 |
| E | 1.00 | 5 | 0.20 |
| F | 2.50 | 5 | 0.50 |
| G | 4.00 | 10 | 0.40 |
| H | 5.00 | 10 | 0.50 |
| I | 3.00 | 15 | 0.20 |
| J | 8.00 | 20 | 0.40 |
| K | 8.00 | 40 | 0.20 |
| L | 16.00 | 40 | 0.40 |

TABLE II

| Symbol of plate material | Hydrophylicity Contact Angle | Grade by inking test | Bond strength by abrasion test | Ratio $\frac{\bar{a}}{\bar{b}}$ |
| --- | --- | --- | --- | --- |
| A | 12.0 | 5 | 2,000 | 0.133 |
| B | 13.0 | 5 | 1,000 | 0.06 |
| C | 13.0 | 5 | 500 | 0.05 |
| D | 13.0 | 5 | 7,000 | 0.20 |
| E | 12.0 | 5 | 7,000 | 0.20 |
| F | 6.0 | 2 | 7,000 | 0.50 |
| G | 13.0 | 5 | 7,000 | 0.40 |
| H | 5.0 | 2 | 7,000 | 0.50 |
| I | 13.0 | 4 | 7,000 | 0.20 |
| J | 13.0 | 5 | 7,000 | 0.40 |
| K | 13.0 | 5 | 7,000 | 0.20 |
| L | 13.0 | 5 | 7,000 | 0.40 |

Grade 5 means the best.
Grade 1 means the worst.
The number 7000 as it appears in Column 4 above indicates 7000 or more inasmuch as the test run was 7000.
Items A, B, and C could only pass 2000, 1000, and 500 times respectively, the Bond strength by abrasion test without any remarkable change.

TABLE III

| Symbol of printing plate | Ratio $\frac{\bar{a}}{\bar{b}}$ | Durability | Ink-stain resistance |
| --- | --- | --- | --- |
| A | 0.133 | 1,000 | 1,000 |
| B | 0.06 | 500 | 7,000 |
| C | 0.05 | 50 | 7,000 |
| D | 0.20 | 7,000 | 7,000 |
| E | 0.20 | 7,000 | 7,000 |
| F | 0.50 | 7,000 | 50 |
| G | 0.40 | 7,000 | 7,000 |
| H | 0.50 | 7,000 | 100 |
| I | 0.20 | 7,000 | 7,000 |
| J | 0.40 | 7,000 | 7,000 |
| K | 0.20 | 7,000 | 7,000 |
| L | 0.40 | 7,000 | 7,000 |

The number 7000 as it appears in Columns 3 and 4 above indicates 7000 or more inasmuch as the test run was 7000.
Items A, B, and C could only pass 1000, 500, and 50 times respectively, the Durability test without remarkable change.
Items A, F, and H could only pass 1000, 50, and 100 times respectively, the Ink-stain resistance test without any remarkable change.

What we claim is:

1. A material for a planographic plate comprising a substrate, a thin layer of a water-resistant adhesive on said substrate, a layer of finely divided solid nonmetallic particles adhered to said thin layer of water-resistant adhesive, said finely divided solid nonmetallic particles being substantially evenly distributed on said thin layer of adhesive, the ratio of the thickness of said thin adhesive layer to the average diameter of said finely divided solid nonmetallic particles being in the range of from 0.2 to 0.4, said finely divided solid nonmetallic particles having hydrophilic surfaces treated with a solution comprising a weak acid, and a coating of photosensitive material on said layer of finely divided solid nonmetallic particles, said photosensitive material comprising a photopolymer as a main ingredient.

2. A planographic-plate material according to claim 1, wherein said substrate is a synthetic-resin film.

3. A planographic-plate material according to claim 1, hwerein said substrate is a thin metallic sheet.

4. A method of preparing a material for a planographic plate which comprises the steps of applying to a substrate a thin layer of a water-resistant adhesive of thickness $\bar{a}$, adhering finely divided solid nonmetallic particles of an average diameter $\bar{b}$ to said thin, water-resistant-adhesive layer by uniform sprinkling, the ratio $\bar{a}/\bar{b}$ of the thickness $\bar{a}$ of the adhesive layer to the average diameter $\bar{b}$ of the finely divided solid nonmetallic particles being in the range of from 0.2 to 0.4, whereby the adhesive does not seep through extremely small voids between said finely divided solid nonmetallic particles to the overlying surface, making the surfaces of said finely divided solid nonmetallic particles hydrophilic by treatment with a solution comprising a weak acid, and coating a layer of the finely divided solid nonmetallic particles whose surfaces have thus become hydrophilic with a photosensitizing agent comprising a photopolymer as a main ingredient.

5. A method of preparing a planographic-plate material according to claim 4 in which said substrate is a synthetic-resin film.

6. A method of preparing a planographic-plate material according to claim 4 in which said substrate is a thin metallic sheet.

7. A material for a planographic plate comprising a substrate, a thin layer of a water-resistant adhesive on said substrate, a layer of finely divided solid metallic particles adhered to said thin layer of water-resistant adhesive, said finely divided solid metallic particles being substantially evenly distributed on said thin layer of adhesive, the ratio of the thickness of said thin adhesive layer to the average diameter of said finely divided solid metallic particles being in the range of 0.2 to 0.4 such that said adhesive does not emerge from the layer of finely divided metallic particles, said finely divided solid metallic particles having hydrophilic surfaces treated with a solution comprising a weak acid, and a coating of photosensitive material on said layer of finely divided solid metallic particles, said photosensitive material comprising a photopolymer as a main ingredient.

8. A planographic-plate material according to claim 7, wherein said substrate is a synthetic resin film.

9. A planographic-plate material according to claim 7, wherein said substrate is a thin metallic sheet.

10. A method of preparing a material for a planographic plate which comprises the steps of applying to a substrate a thin layer of a water-resistant adhesive of thickness $\bar{a}$, adhering finely divided solid metallic particles of an average diameter $\bar{b}$ to said thin, water-resistant-adhesive layer by uniform sprinkling, the ratio $\bar{a}/\bar{b}$ of the thickness $\bar{a}$ of the adhesive layer to the average diameter $\bar{b}$ of the finely divided solid metallic particles being in the range of from 0.2 to 0.4, whereby the adhesive does not seep through extremely small voids between said finely divided solid metallic particles to the overlying surface, making the surfaces of said finely divided solid metallic particles hydrophilic by treatment with a solution comprising a weak acid, and coating a layer of the finely divided solid metallic particles whose surfaces have thus become hydrophilic with a photosensitizing agent comprising a photopolymer as a main ingredient.

11. A method of preparing a planographic-plate material according to claim 10, in which said substrate is a synthetic-resin film.

12. A method of preparing a planographic-plate material according to claim 10, in which said substrate is a thin metallic sheet.

* * * * *